United States Patent
Teshome et al.

(10) Patent No.: US 7,305,760 B2
(45) Date of Patent: Dec. 11, 2007

(54) SYSTEM AND METHOD FOR CAPACITIVE COUPLED VIA STRUCTURES IN INFORMATION HANDLING SYSTEM CIRCUIT BOARDS

(75) Inventors: Abeye Teshome, Austin, TX (US); Lan Zhang, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 364 days.

(21) Appl. No.: 10/924,629

(22) Filed: Aug. 24, 2004

(65) Prior Publication Data

US 2006/0044895 A1    Mar. 2, 2006

(51) Int. Cl.
*H01R 43/00* (2006.01)
*H05K 13/00* (2006.01)

(52) U.S. Cl. ......................................... 29/831; 29/854
(58) Field of Classification Search .................. 29/825, 29/846, 829, 854, 831
See application file for complete search history.

(56) References Cited

U.S. PATENT DOCUMENTS

| | | | |
|---|---|---|---|
| 5,636,099 A | 6/1997 | Sugawara et al. ........... 361/278 |
| 5,761,049 A * | 6/1998 | Yoshidome et al. ........ 361/782 |
| 5,973,929 A | 10/1999 | Arakawa et al. ............ 361/762 |
| 6,252,177 B1 * | 6/2001 | Stoddard ..................... 174/260 |
| 6,661,316 B2 | 12/2003 | Hreish et al. ................ 333/246 |
| 6,791,429 B2 | 9/2004 | Mikalauskas ................... 333/1 |
| 6,961,231 B1 * | 11/2005 | Alexander et al. ........ 361/321.2 |
| 2006/0043987 A1* | 3/2006 | Van Horn et al. .......... 324/754 |
| 2006/0225916 A1* | 10/2006 | Nelson et al. ............... 174/255 |

* cited by examiner

*Primary Examiner*—Jeremy C Norris
(74) *Attorney, Agent, or Firm*—Hamilton & Terrile, LLP; Robert W. Holland

(57) ABSTRACT

Power supplied to an information handling system electronic component through a circuit board has component package inductance parasitic effects compensated by configuring connections to the electronic component to have increased parasitic capacitance. For instance, power and ground vias that connect a processor to power and ground planes of the circuit board are aligned to create a desired parasitic capacitance that reduces the impact of parasitic inductance relating to signal compensation, power delivery and high speed decoupling. The desired distributed capacitance is modeled by altering the radius associated with the equivalent line charge of the power via, the distance associated with the line charges between power and ground vias, and the via barrel length.

10 Claims, 4 Drawing Sheets

SYSTEM AND METHOD FOR CAPACITIVE COUPLED VIA STRUCTURES IN INFORMATION HANDLING SYSTEM CIRCUIT BOARDS

BACKGROUND OF THE INVENTION

1. Field of the Invention

The present invention relates in general to the field of information handling system circuit boards, and more particularly to a system and method for capacitive coupled via structures between circuit board ground, power and circuit planes.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Over the past several decades, information handling systems have steadily increased their capacity to process and store information in designs having compact footprints. These improvements have been largely based on the availability of processors to handle greater numbers of computations with increased speed by fabricating increased numbers of circuits within a given size of semiconductor material. The processor designs have improved by increasing the number of cycles performed in a given time frame and decreasing the operating voltages. Improved processors allow more rapid execution of application instructions for interaction with an information handling system user as well as improved communication of information through busses that interface various components of an information handling system, such as memory, network interfaces and graphic display interfaces. Information handling system designers face a substantial challenge in interfacing the various components through a circuit board. For instance, design challenges include arranging components in a compact footprint with ease of assembly and adequate cooling. One type of circuit board-to-processor interface that has become increasingly common is the ball grid array (BGA) connector and socket. BGA sockets provide high density, high input/output count packaging with reduced pin-to-pin trace gaps by distributing the ball and grid connections between the processor and the circuit board.

One difficulty often faced in the design of information handling system circuit boards is that the speed, density and power requirements of powerful processors tend to generate undesired electromagnetic effects and interference. For instance, parasitic inductance is associated with the physical structure of integrated circuits. The parasitic inductance tends to disrupt power supply to the integrated circuit, especially at current flows having lower voltages and greater transient surges to meet the demands of powerful modern processors. Small parasitic effects have more pronounced effects on power delivery to processors, especially in transient conditions, as operating voltages decrease. Discrete component solutions are typically employed to reduce the undesired impact on power supply and delivery, such as associating capacitance with a power supply circuit board wire line to smooth current flow during transient power demands. However, the ability of discrete component solutions to compensate for power delivery, decoupling and processor package parasitic effects has fallen behind as processor density has increased and supply voltage decreased, especially in highly utilized areas of a circuit board such as near BGA socket connectors.

SUMMARY OF THE INVENTION

Therefore a need has arisen for a system and method which reduces power delivery, decoupling and package parasitic effects on information handling system circuit board designs.

In accordance with the present invention, a system and method are provided which substantially reduce the disadvantages and problems associated with previous methods and systems for power supply to information handling system components through a circuit board. Power, ground and signal vias connecting with the component are configured according to one or more factors to create a desired level of parasitic capacitance. The parasitic capacitance offsets the impact of parasitic inductance associated with the component on the supply of power to the component, such as impacts relating to parasitic inductance that arise during power transients.

More specifically, an information handling system circuit board has a ball grid array processor socket disposed on its surface plane to interface processor connectors with circuit board signal wirelines through socket connectors. Power is provided to the processor from a power plane through a socket connector by a power via having a barrel length extending from the power plane to the socket. Ground is provided to the processor from a ground plane through a socket connector by a ground via having a barrel length extending from the ground plane to the socket. Application of power to the processor faces the parasitic inductance that disrupts power delivery, signal compensation and high speed decoupling. The power, ground and signal vias are configured to create a desired parasitic capacitance to offset the parasitic inductance. The desired parasitic capacitance is created by consideration of one or more factors including, the radius associated with the power via equivalent line charge, the distance associated with the line charges between capacitively coupled vias and the via barrel length.

The present invention provides a number of important technical advantages. One example of an important technical advantage is that coupled via structures reduce the impact of package parasitics, such as inductance, with the presence of greater parasitic capacitance. The increased parasitic capacitance reduces or eliminates the need for discrete component solutions and provides improved signal compensation, power delivery and high speed decoupling. For instance, greater parasitic capacitance of between 0.1 pF and 0.4 pF may be generated for each capacitively coupled via structure in highly utilized areas of a circuit board design, such as BGA locals, depending upon the spatial geometry of the coupled via structure.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Information handling system power supply to low voltage electronic components has the effect of parasitic inductance during power transients reduced by configuring power and ground vias associated with the electronic component to have a desired parasitic conductance. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
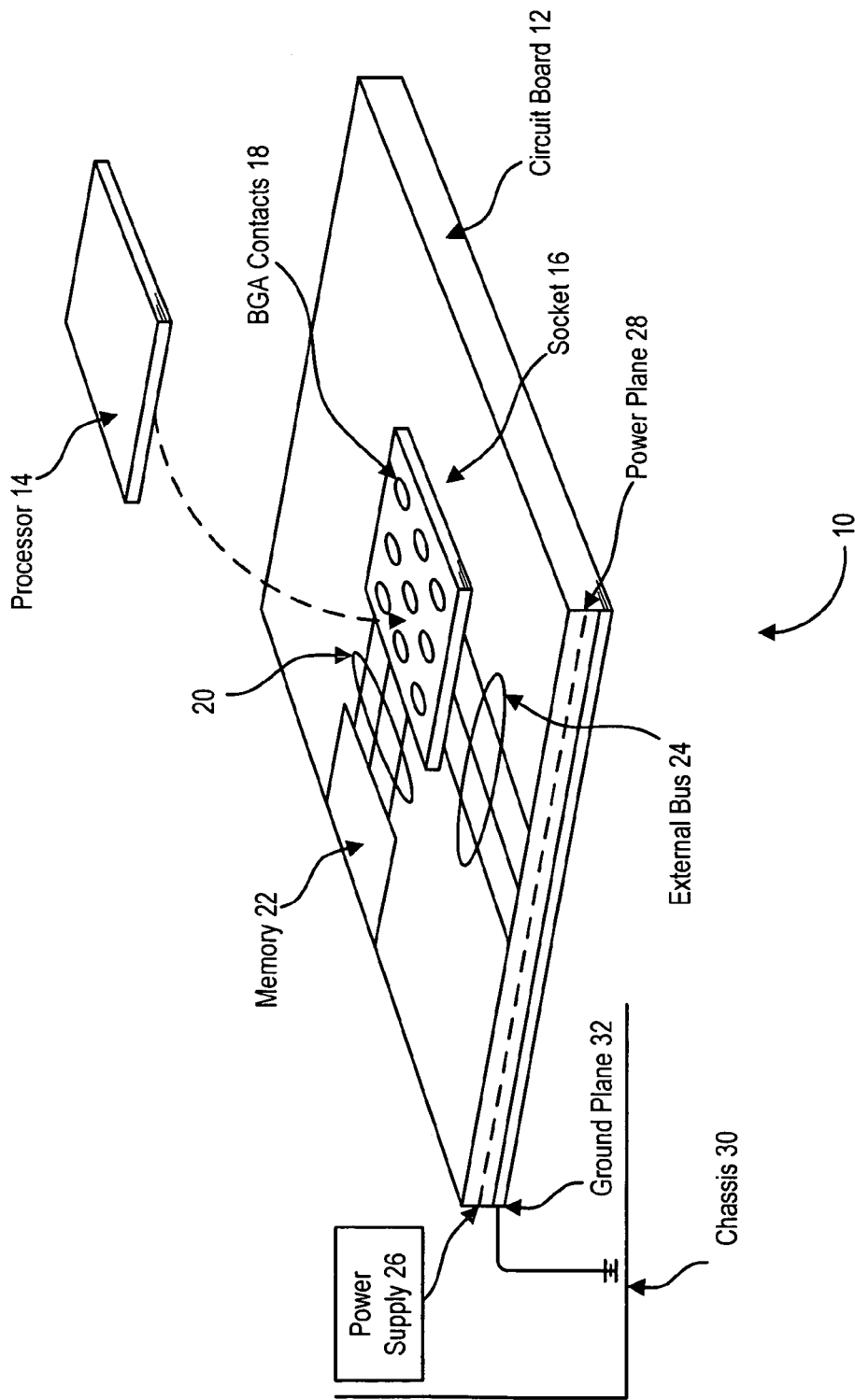
FIG. 1 an information handling system 10 having a circuit board and processor.

Referring now to FIG. 1, an information handling system 10 is depicted having processing components disposed on a circuit board 12 to process information. For instance, a processor 14 couples to a socket 16, the socket physically securing the processor to circuit board 12 and electronically interfacing the processor with other processing components. Socket 16 has ball grid array contacts 18 that interface with wirelines integrated along the surface of circuit board 12, such as a memory bus 20 connected to memory 22 or an external bus 24 that communicates with processing components external to circuit board 12. The wirelines are etched along the surface plane of circuit board 12 and protected by a covering insulating layer, although signal wires may extend through various layers of circuit board 12. Signal vias connect the wirelines with the socket contacts 18 by extending vertically through the insulating layer. A power supply 26 provides power to one or more socket contacts 18 through a power plane 28 of circuit board 12. A power via extends vertically between power plane 28 and a socket contact 18 to provide power to processor 14. The ground of information handling system 10 is the chassis 30 which connects to a ground plane 32 of circuit board 12. A ground via extends vertically between ground plane 32 and a socket contact 18 to provide ground to processor 14.

Application of power to processor 14 results in package parasitic effects, such as parasitic inductance and parasitic capacitance, that have intensified impact on power delivery, high speed decoupling and signal compensation with increased processor speed, increased circuit board wiring density and reduced power voltages. In particular, parasitic inductance adversely impacts power delivery during transient conditions, especially where processors power demands increase more instantaneously with relatively low supply voltages. In contrast, parasitic capacitance tends to aid power delivery by reducing the impact of parasitic inductance during transient conditions. Inter via spatial relationships define the amount of parasitic capacitance with strong dependencies on via structure within circuit board 12. For instance, in a typical circuit board design, a range of between 0.1 pF and 0.4 pF of capacitance are available per via structure depending on the spatial via geometry. Configuring power, ground and signal vias according to factors associated with parasitic capacitance allows the integration of a desired parasitic capacitance to a power delivery solution to the effects of parasitic inductance. For instance, the radius associated with the equivalent line charge of a power via, the distance associated with the line charges between associated power and ground vias and the via barrel length are used as factors to build a model and simulation of the circuit board that calculates the parasitic capacitance, such as the Q3D and Etch Spies modeling systems. The increase and locality of the capacitive parasitics through via configuration offsets package inductance, appearing as distributed capacitance that provides local high speed decoupling at the socket contacts of an electronic component.

Figure 2:
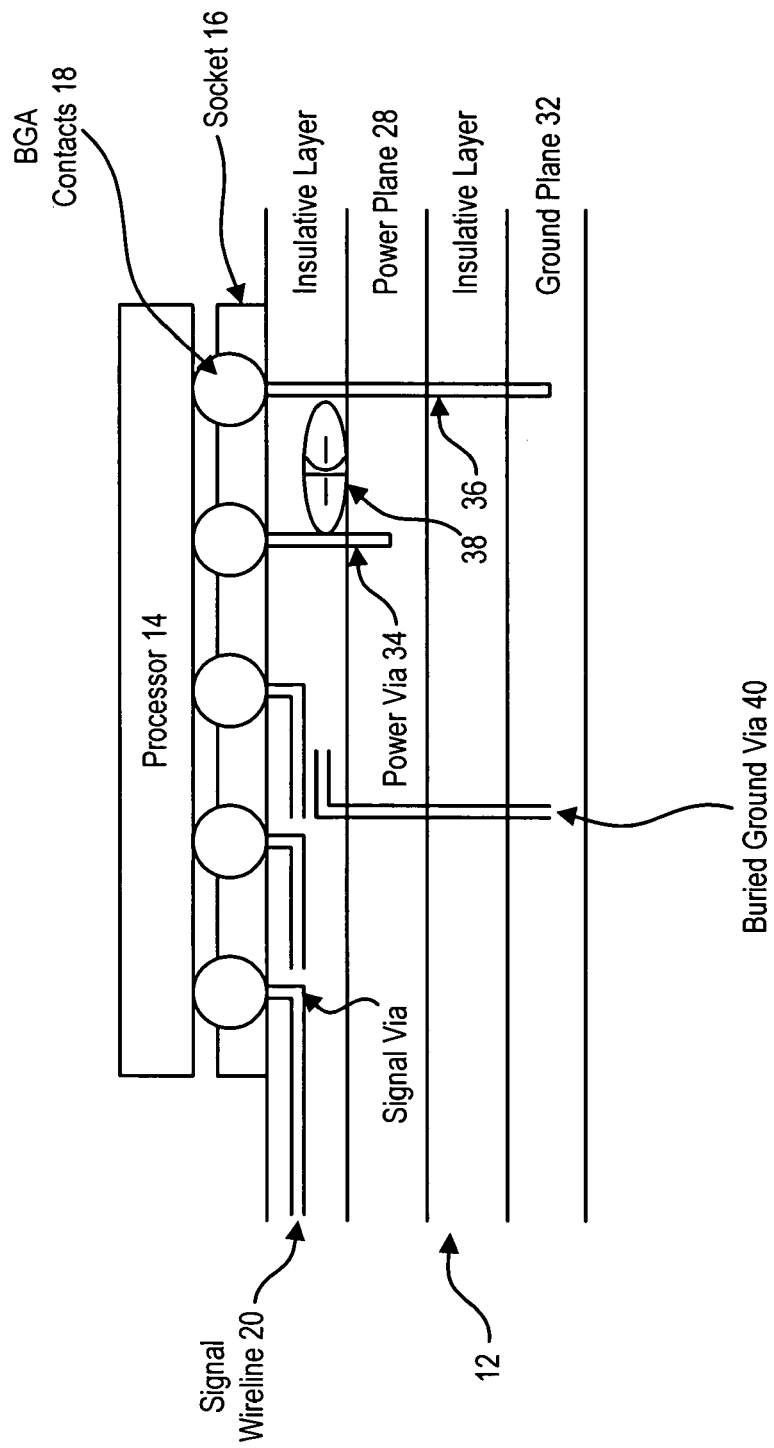
FIG. 2 depicts a cutaway view of a circuit board configured to create a predetermined parasitic capacitance that compensates for parasitic inductance.

Referring now to FIG. 2, a side cutaway view is depicted of a circuit board 12 configured to create a predetermined parasitic capacitance that compensates for processor 14 packaging parasitic inductance. Power via 34 is positioned in a predetermined proximity to ground via 36 to create a desired capacitance 38 related to current flow from application of power to processor 14. Similarly, a buried ground via extends from ground plane 32 to a position proximate to one or more signal wirelines 20 to create a desired capacitance associated with communication of signals through the signal wireline 20. Vias are capacitively coupled in this manner to create a desired distributed capacitance by modeling and simulating circuit board configurations to identify via positions having the desired parasitic capacitance. For instance, power or signal vias are paired with one or more ground vias or buried ground vias to form a structure having a desired parasitic capacitance. With more complex modeling, multiple structures, each having multiple vias, are defined to provide capacitance that offsets the effects of parasitic inductance in combination with conventional discrete component solutions. The buried ground vias may be routed throughout the proximity of processor 14 in various shapes and may encase or partially encase power or signal vias in a cylinder shape that surrounds the power or signal via. In one embodiment, processor 14 socket connection definitions are defined to increase the utility of capacitively coupled via structures that create capacitance by application of power to the processor. For instance, signal, ground and power connections of the processor are positioned on the processor to support creation of desired capacitance by vias connecting to the signal, ground and power connections through the circuit board.

Figure 3:
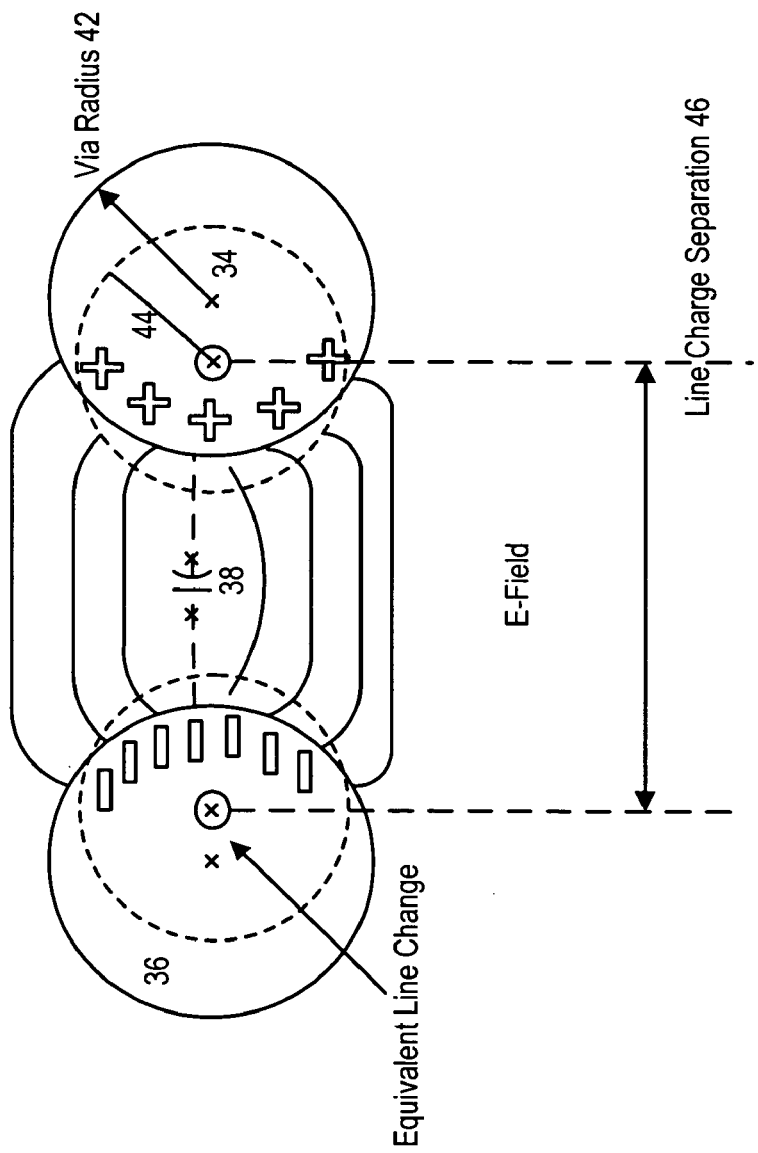
FIG. 3 depicts non-uniform charge distribution and equivalent line charge offset of a power and ground via.
Figure 4:
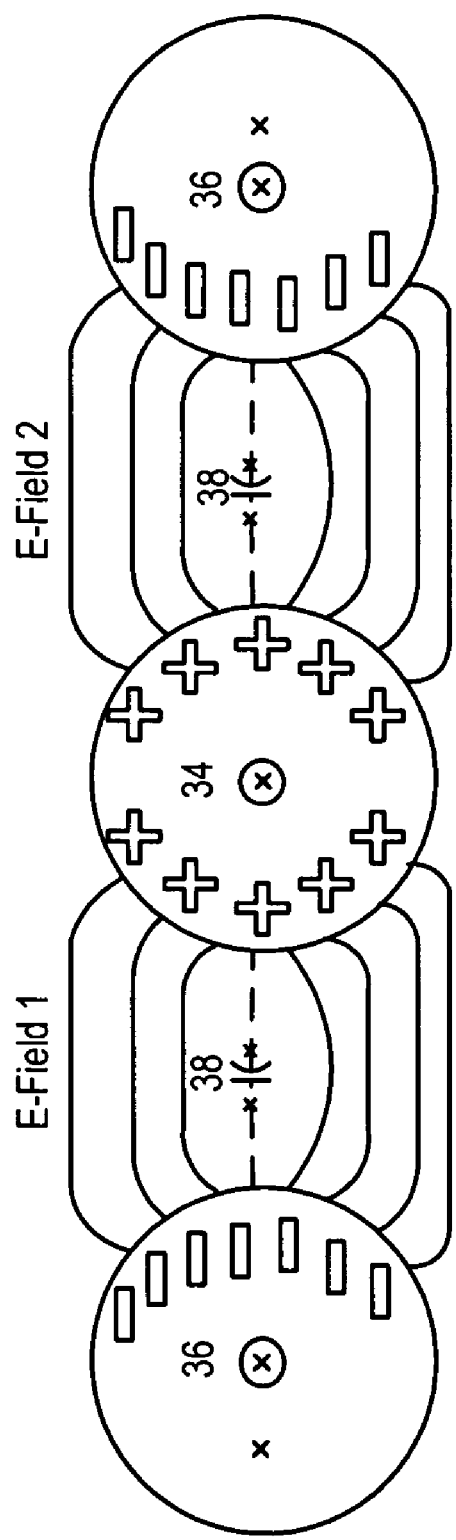
FIG. 4 depicts parasitic capacitance associated with plural ground vias configured proximate a power via.

Referring now to FIGS. 3 and 4, top views of various configurations of power and ground vias are depicted to illustrate factors associated with creation of desired parasitic capacitance. FIG. 3 depicts a non uniform charge distribution and equivalent line charge offset of a single pair of a power via 34 and ground via 36. One factor applied to increase parasitic capacitance to a desired level is the radius 42 of power via 34 and the radius 44 associated with the power via equivalent line charge. In FIG. 3, the equivalent line charge radius 44 is offset from the physical via radius 42 due to the non-uniformity of charge distribution from the proximity of the single ground via 36. By comparison, the equivalent line charge radius and physical radius of FIG. 4 overlap due to the uniform charge distribution provided by plural ground vias. Another factor applied to increase parasitic capacitance to a desired level is the distance associated with the line charges between capacitively coupled vias, depicted by numeral 46 of FIG. 3 and measured as the separation between the equivalent line charge radii 44 of power via 34 and ground via 36. Another factor is the via barrel length of the power and ground vias, measured as the vertical distance from a socket connection to termination in the power or ground planes.

Although the present invention has been described in detail, it should be understood that various changes, substitutions and alterations can be made hereto without departing from the spirit and scope of the invention as defined by the appended claims.

The invention claimed is:

1. A method for configuring one or more electronic components on a circuit board, the electronic components operable to process information with electronic current, the current effected by parasitic inductance and parasitic capacitance associated with the electronic component, the method comprising:
disposing the electronic component on a surface plane of the circuit board;
connecting a power via from a power connection of the electronic component through the surface plane to a power plane of the circuit board;
connecting a ground via from a ground connection of the electronic component through the surface plane to a ground plane of the circuit board; and
aligning the position where the power via passes through the surface plane relative to the position where the ground via passes through the surface plane according to one or more factors associated with creating increased distributed capacitance.

2. The method of claim 1 wherein the one or more factors comprise the radius associated with the power via equivalent line charge, the distance associated with the line charges between the power and ground vias and the via barrel length.

3. The method of claim 1 wherein aligning the power via and ground via further comprises:
locating the electronic component power and ground connections in a predetermined position to align with the power via and ground via according to the one or more factors.

4. The method of claim 3 wherein the electronic component comprises a ball grid array processor, and the power and ground connections comprise a ball grid array socket.

5. The method of claim 4 further comprising:
aligning a signal via with a ground via according to the one or more factors associated with creating increased parasitic capacitance.

6. The method of claim 1 wherein aligning the power and ground via further comprise aligning the power and plural ground vias, the plural ground vias aligned according to the one or more factors associated with creating increased parasitic capacitance.

7. The method of claim 1 wherein aligning the power and ground via further comprises:
modeling the circuit board and electronic component connections to predict parasitic capacitance; and
aligning the power and ground vias to create a selected level of parasitic capacitance.

8. The method of claim 1 further comprising:
burying one or more wires within the circuit board proximate a power via, the wire positioned according to the one or more factors to create a selected level of parasitic capacitance.

9. A method for powering electronic components coupled to an information handling system circuit board, the powering creating parasitic inductance and parasitic capacitance, the method comprising:
interfacing the electronic component to power with a power via;
interfacing the electronic component to ground via ground via; and
configuring the power via and plural ground vias to pass through the circuit board in positions relative to each other to create a desired parasitic capacitance, the parasitic capacitance offsetting the effects of the parasitic inductance on power applied to the electronic component wherein at least one of the plural ground vias is connected to the electronic component and one of the plural ground vias is not connected to the electronic component.

10. The method of claim 9 wherein configuring the power via and ground via to create a desired parasitic capacitance further comprises:
modeling the parasitic capacitance based on the radius associated with the equivalent line charge of the power via, the distance associated with the line charges between the power and ground via and the via barrel length; and
selecting a configuration of power and ground vias having a modeled parasitic capacitance of the desired parasitic capacitance.

* * * * *